United States Patent
Wu et al.

(10) Patent No.: US 11,644,748 B2
(45) Date of Patent: May 9, 2023

(54) MULTI-VOLUME BAKING CHAMBER FOR MASK CLEAN

(71) Applicant: Applied Materials, Inc., Santa Clara, CA (US)

(72) Inventors: Banqiu Wu, San Jose, CA (US); Khalid Makhamreh, Los Gatos, CA (US); Eliyahu Shlomo Dagan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/226,775

(22) Filed: Apr. 9, 2021

(65) Prior Publication Data

US 2022/0326606 A1    Oct. 13, 2022

(51) Int. Cl.
*G03F 1/82* (2012.01)
*G03F 7/20* (2006.01)
*G03F 7/16* (2006.01)

(52) U.S. Cl.
CPC ............... *G03F 1/82* (2013.01); *G03F 7/168* (2013.01); *G03F 7/70825* (2013.01); *G03F 7/70841* (2013.01); *G03F 7/70875* (2013.01)

(58) Field of Classification Search
CPC ........ G03F 1/82; G03F 7/168; G03F 7/70825; G03F 7/70841; G03F 7/70875
See application file for complete search history.

(56) References Cited

U.S. PATENT DOCUMENTS

| | | | |
|---|---|---|---|
| 6,033,474 A | 3/2000 | Mita et al. | |
| 6,707,011 B2 | 3/2004 | Tay et al. | |
| 10,544,519 B2 * | 1/2020 | Savas | H01J 37/32651 |
| 2012/0315578 A1 | 12/2012 | Lee et al. | |
| 2014/0027060 A1 | 1/2014 | Ranish et al. | |
| 2018/0218928 A1 * | 8/2018 | Peh | H01L 21/68742 |
| 2019/0228964 A1 | 7/2019 | Yamada et al. | |
| 2019/0384178 A1 | 12/2019 | Yang | |

FOREIGN PATENT DOCUMENTS

| | | | |
|---|---|---|---|
| JP | 2011099956 A | 5/2011 | |
| JP | 2015-022150 A | 2/2015 | |

OTHER PUBLICATIONS

International Search Report for PCT/US2022/024126, dated Aug. 1, 2022.

* cited by examiner

*Primary Examiner* — Hung V Nguyen
(74) *Attorney, Agent, or Firm* — Moser Taboada

(57) ABSTRACT

Embodiments of baking chambers for baking a photomask are provided herein. In some embodiments, a baking chamber includes: a chamber body enclosing a first interior volume and a second interior volume, disposed beneath and fluidly independent from the first interior volume; a radiant heat source disposed in the first interior volume; a photomask support structure configured to support a photomask disposed in the second interior volume; a window disposed between the first interior volume the second interior volume, wherein the window is made of a material that is transparent to thermal radiation; a first gas inlet and a first gas outlet coupled to the first interior volume; and a second gas inlet and a second gas outlet coupled to the second interior volume on opposite ends thereof to facilitate flow of a process gas laterally through the second interior volume and across the photomask support structure.

15 Claims, 4 Drawing Sheets

MULTI-VOLUME BAKING CHAMBER FOR MASK CLEAN

FIELD

Embodiments of the present disclosure generally relate to substrate processing equipment.

BACKGROUND

Substrates for use in the semiconductor manufacturing industry are often cleaned to remove unwanted materials such as contaminants or other unwanted particles generated thereon during processing. Substrates may include semiconductor wafer, chamber components, photomasks, or the like. After undergoing a wet dean or a dry dean process, the substrate may include leftover moisture, residue, or haze. Baking chambers may be used to remove the leftover moisture, unwanted particles, or haze from the substrate. However, heating parts and materials around heating parts in typical baking chambers can be oxidized to create defects, or high temperatures can shed particles from surfaces of the heating parts due to thermal stress, contaminating the substrate.

Accordingly, the inventors have provided improved baking chambers for cleaning substrates.

SUMMARY

Embodiments of baking chambers for baking a photomask are provided herein. In some embodiments, a baking chamber for baking a photomask includes: a chamber body enclosing a first interior volume and a second interior volume, disposed beneath and fluidly independent from the first interior volume; a radiant heat source disposed in the first interior volume; a photomask support structure configured to support a photomask disposed in the second interior volume; a window disposed between the first interior volume the second interior volume, wherein the window is made of a material that is transparent to thermal radiation such that radiant energy from the radiant heat source can enter the second interior volume through the window and impinge upon the photomask support structure; a first gas inlet and a first gas outlet coupled to the first interior volume; and a second gas inlet and a second gas outlet coupled to the second interior volume on opposite ends thereof to facilitate flow of a process gas laterally through the second interior volume and across the photomask support structure.

In some embodiments, a baking chamber for baking a photomask includes: a chamber body enclosing a first interior volume and a second interior volume, disposed beneath and fluidly independent from the first interior volume; a radiant heat source comprising an infrared (IR) lamp disposed in the first interior volume; a photomask support structure configured to support a photomask disposed in the second interior volume; a window disposed between the first interior volume the second interior volume, wherein the window is made of a material that is transparent to thermal radiation such that radiant energy from the radiant heat source can enter the second interior volume through the window and impinge upon the photomask support structure; a first gas inlet and a first gas outlet coupled to the first interior volume; and a second gas inlet and a second gas outlet coupled to the second interior volume on opposite ends thereof to facilitate flow of a process gas laterally through the second interior volume and across the photomask support structure.

In some embodiments, a method of baking a photomask in a baking chamber includes: pumping down a lower volume of the baking chamber to a vacuum pressure; placing a photomask on a support in the lower volume of the baking chamber; and heating the photomask via a radiant heat source disposed in an upper volume of the baking chamber separated from the lower volume via a window that is transparent to infrared radiation to dissociate photomask residue on the photomask.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
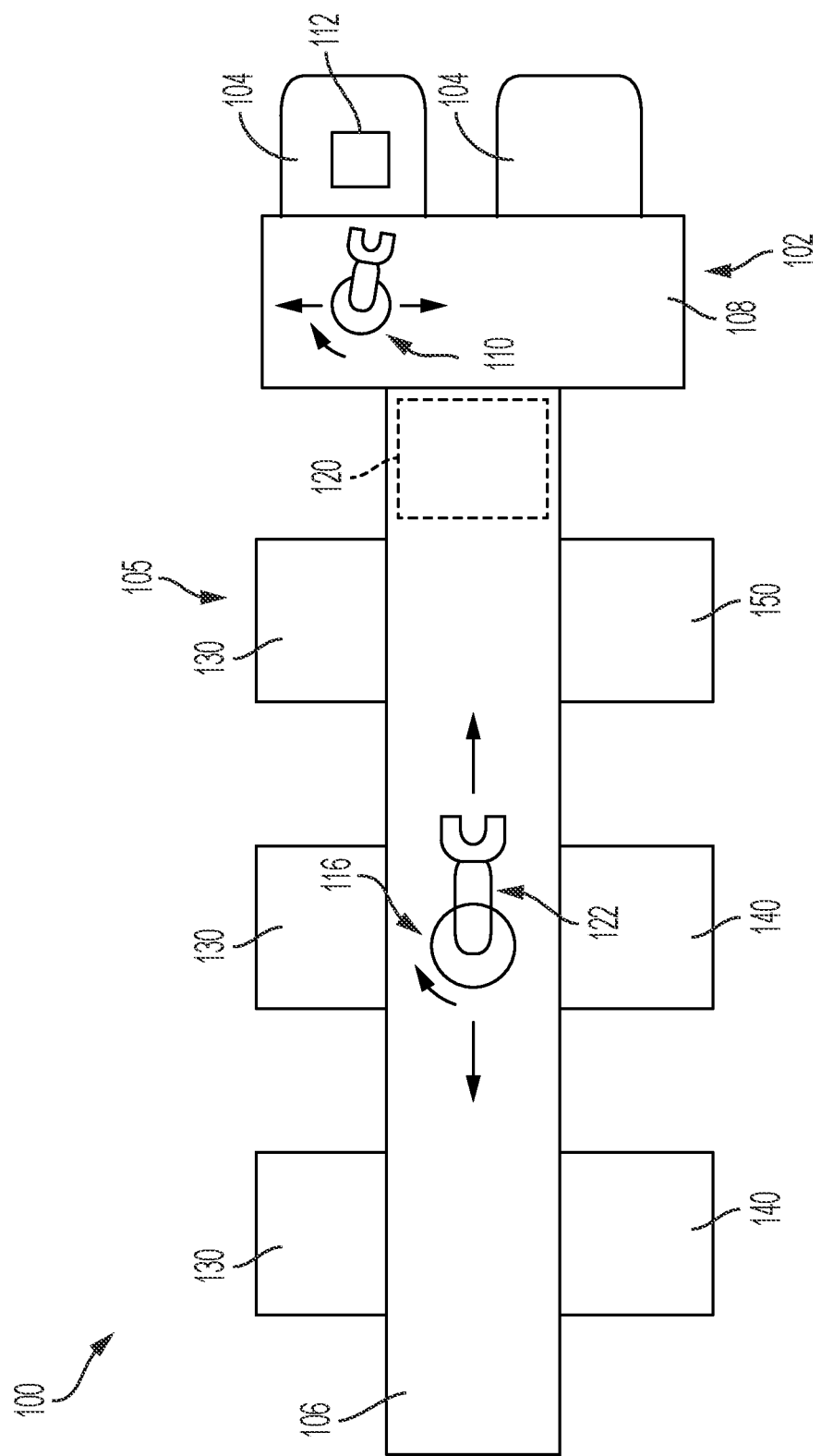
FIG. 1 depicts a schematic view of a multi-chamber processing tool having a baking chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of baking chambers for baking substrates are provided herein. The baking chambers are configured to heat the substrates to remove unwanted particles or residue after the substrates undergo a wet clean or a dry clean process. The substrates may be, for example, semiconductor wafers, photomasks, or the like. In the example of the photomasks, ammonium sulfate residue, or haze, may be left on the photomask after a wet clean or dry clean process. Heating a surface of the photomask to about 70 to about 150 deg Celsius causes the ammonium sulfate residue to dissociate from the photomask. The dissociated residue may then be removed from an interior volume of the baking chamber.

FIG. 1 depicts a schematic view of a multi-chamber processing tool (tool) 100 having a baking chamber 150 in accordance with at least some embodiments of the present disclosure. The tool 100 generally includes a factory interface 102, a transfer chamber 106 coupled to the factory interface 102, and a plurality of process chambers 105, including the baking chamber 150 coupled to the transfer chamber 106. The factory interface 102 includes a plurality of loadports 104 for receiving one or more substrates 112. The one or more substrates 112 may be semiconductor wafers, carrier substrates, photomasks, or the like. In some embodiments, the plurality of loadports 104 are arranged along a common side of the factory interface 102. A factory interface robot 110 may be disposed in an interior volume 108 of the factory interface 102 to shuttle or transport the one or more substrates 112 from the plurality of loadports 104 to the transfer chamber 106. The factory interface robot 110 may be configured for rotational movement within the interior volume 108, lateral movement within the interior volume 108, or both.

The transfer chamber 106 is coupled to the factory interface 102, and in some embodiments, is disposed on a side of the factory interface 102 opposite the plurality of loadports 104. The transfer chamber 106 includes a transfer robot 116 disposed therein for shuttling the one or more substrates 112 received from the factory interface robot 110 to the one or more process chambers 105 coupled to the transfer chamber. The transfer robot 116 may be configured for rotational movement, lateral movement, or both. For example, lateral movement may be achieved via rails on a floor of the transfer chamber 106 or via wheels or tracks under the transfer robot 116. An arm 122 of the transfer robot 116 may expand and contract to move the one or more substrates 112 into and out of respective chambers of the plurality of process chambers 105.

In some embodiments, the transfer robot 116 is configured to directly receive the one or more substrates 112 from the factory interface robot 110. In some embodiments, the transfer robot 116 is configured to indirectly receive the one or more substrates 112 from the factory interface robot 110. For example, in some embodiments, one of the factory interface 102 or the transfer chamber 106 includes a buffer 120 configured to hold one or more of the one or more substrates 112. The transfer robot 116 may be configured to transfer the one or more substrates 112 to the buffer 120 and the transfer robot 116 may be configured to transfer the one or more substrates 112 from the buffer 120 to the plurality of process chambers 105 and from the plurality of process chambers 105 back to the buffer 120.

The transfer chamber 106 may have one or more environmental controls. For example, an airflow opening in the transfer chamber 106 may include a filter to filter the airflow entering the transfer chamber 106. Other environmental controls may include one or more of humidity control, static control, temperature control, or pressure control.

The one or more process chambers 105 may be coupled orthogonally to the transfer chamber 106 or may be coupled at an angle with respect to the transfer chamber 106. The plurality of process chambers 105 may be sealingly engaged with the transfer chamber 106. The transfer chamber 106 generally operates at atmospheric pressure but may be configured to operate at vacuum pressure. The plurality of process chambers 105 are configured to perform one or more processing steps to one or more substrates 118 being processed in the tool 100. For example, the plurality of process chambers 105 may comprise one or more wet clean chambers 130 (three shown in FIG. 1) configured to clean the one or more substrates 112 with a liquid, for example, water. The plurality of process chambers 105 may comprise one or more dry clean chambers 140 (two shown in FIG. 1) configured to perform a dry clean process on the one or more substrates 112, for example, via a plasma etch or plasma ashing procedure. The one or more process chambers 105 includes at least one baking chamber, for example, the baking chamber 150 configured to heat the one or more substrates to remove residue or haze left over after the wet clean or dry clean process. In some embodiments, the one or more wet clean chambers 130 are disposed on a side of the transfer chamber 106 different than the one or more dry clean chambers 140.

Figure 2:
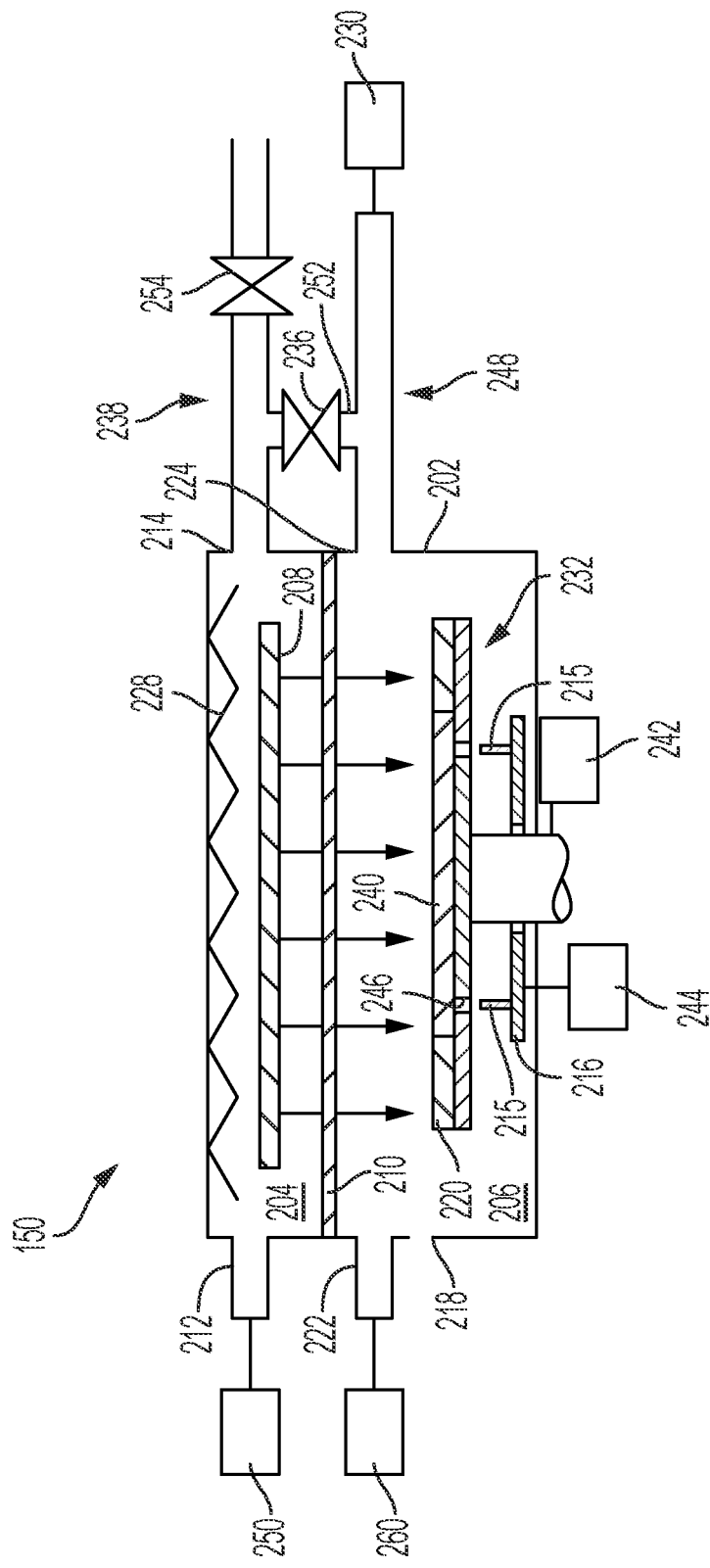
FIG. 2 depicts a schematic cross-sectional side view of a baking chamber in accordance with at least some embodiments of the present disclosure.

FIG. 2 depicts a schematic cross-sectional side view of a baking chamber 150 in accordance with at least some embodiments of the present disclosure. The baking chamber 150 may be part of a multi chamber process tool such as tool 100, or a standalone chamber. The baking chamber 150 generally comprises a chamber body 202 enclosing a first interior volume 204 and a second interior volume 206, disposed beneath and fluidly independent from the first interior volume 204. In some embodiments, the first interior volume 204 is configured to operate at non-vacuum pressure, and the second interior volume 206 is configured to operate at vacuum pressure. In some embodiments, both the first interior volume 204 and the second interior volume 206 are configured to operate at vacuum pressure. The chamber body 202 may be made of a metal, such as aluminum or stainless steel.

A radiant heat source 208 is disposed in the first interior volume 204. In some embodiments, the radiant heat source 208 comprises one or more infrared (IR) lamps arranged in a suitable pattern. In some embodiments, a surface temperature of the radiant heat source 208 may be about 1000 degrees Celsius or greater during use. In some embodiments, the radiant heat source 208 is configured to heat the second interior volume 206 to about 70 to about 150 degrees.

A window 210 is disposed between the first interior volume 204 and the second interior volume 206. The window 210 is made of a material that is transparent to thermal radiation such that radiant energy from the radiant heat source 208 can enter the second interior volume 206 through the window 210. The window 210 advantageously allows radiant energy to pass through the window 210 while preventing any particles shed from the high heat of the radiant heat source 208 from passing through the window 210. In some embodiments, the window 210 is made of a material having a transmission coefficient of 0.75 or greater. In some embodiments, the window 210 is made of potassium bromide, zinc selenide, zinc sulfide, or potassium chloride. In some embodiments, the window 210 is made of a solid material with no through holes. In some embodiments, the window 210 is coupled to sidewalls of the chamber body 202. In some embodiments, an upper surface of the window 210 has a direct line of sight to the radiant heat source 208.

In some embodiments, a top reflector 228 made of a suitable material is disposed in the first interior volume 204 and configured to direct thermal radiation to the window 210. In some embodiments, the top reflector 228 is disposed in the first interior volume 204 on a side of the radiant heat source 208 opposite the window 210. The top reflector 228 may have any suitable shape, such as one or more concave, convex, or angled surfaces.

A photomask support structure 232 configured to support a substrate 240 is disposed in the second interior volume 206. The substrate 240 may be one of the one or more substrates 112 of FIG. 1. In use, radiation from the radiant heat source 208 enters through the window 210 and is configured to impinge upon the photomask support structure 232 and the substrate 240 when disposed on the photomask support structure. In some embodiments, a mask edge ring 220 is disposed on the photomask support structure and configured to surround the substrate 112 to enhance temperature uniformity of the substrate 240. In some embodiments, the photomask support structure 232 is a simple support with no chucking features, for example, no electrostatic chucking or vacuum chucking features. In some embodiments, the photomask support structure 232 does not include any heating or cooling features. For example, the photomask support structure 232 does not include any cooling channels. In some embodiments, the second interior volume 206 does not include any heating elements, and the radiant heat source 208 is the source of heat provided to the substrate 240 via the window 210. In some embodiments, an outer diameter of the radiant heat source 208 is greater than an outer diameter of the substrate 240.

In some embodiments, a lift mechanism 242 is coupled to the photomask support structure 232 and configured to raise or lower the photomask support structure 232 in the second interior volume 206. In some embodiments, the photomask support structure 232 includes one or more lift pin openings 246 configured to facilitate lift pins 215 therethrough. In some embodiments, one or more second lift mechanisms 244 are coupled to the lift pins 215 and configured to raise or lower the lift pins 215. In some embodiments, the lift pins 215 are coupled to a platform 216 and the one or more second lift mechanisms 244 comprise a single second lift mechanism configured to raise or lower the platform 216 so that the lift pins are raised or lowered in unison. In some embodiments, the lift pins 215 are coupled to respective ones of the one or more second lift mechanisms 244 to independently control the raising or lowering of each of the lift pins 215.

In some embodiments, a first gas inlet 212 and a first gas outlet 214 are coupled to the first interior volume 204 to flow a first process gas through the first interior volume 204. The first gas inlet 212 is coupled to a first gas source 250 having an inert gas or air, for example, clean dry air (CDA). In some embodiments, the first gas inlet 212 and the first gas outlet 214 are disposed on opposite sides of the chamber body 202 and configured to flow the first process gas across the radiant heat source 208.

A second gas inlet 222 and a second gas outlet 224 are coupled to the second interior volume 206 to pressurize or purge the second interior volume 206. In some embodiments, the second gas inlet 222 and the second gas outlet 224 are disposed on opposite ends of the second interior volume 206 to facilitate flow of a second process gas laterally through the second interior volume 206 and across the photomask support structure 232. The second gas inlet 222 is coupled to a second gas source 260 having an inert gas or air, for example, clean dry air (CDA). In some embodiments, the first gas source 250 and the second gas source 260 include similar gases. In some embodiments, the first gas source 250 and the second gas source 260 are the same gas source. In some embodiments, the first process gas and the second process gas are non-reactive gases.

In some embodiments, the first gas outlet 214 is fluidly coupled to a first gas line 238 that extends outside of the chamber body 202. In some embodiments, the first gas line 238 includes a bypass valve 254 to control a flow of the first process gas that is exhausted from the first interior volume 204 via the first gas outlet 214. In some embodiments the second gas outlet 224 is fluidly coupled to a vacuum line 248 that extends outside of the chamber body 202 between the second gas outlet 224 and a vacuum pump 230. The vacuum pump 230 is configured to provide vacuum pressure in the second interior volume 206 or both the first interior volume 204 and the second interior volume 206. In some embodiments, the first gas line 238 is coupled to the vacuum line 248 via a vacuum bypass line 252 having a vacuum valve 236. When the vacuum valve 236 is open and the bypass valve is closed, the first interior volume 204 may be pumped down to vacuum pressure. When the first interior volume 204 is operating at atmospheric pressure, the vacuum valve 236 is closed and the bypass valve is opened.

Figure 3:
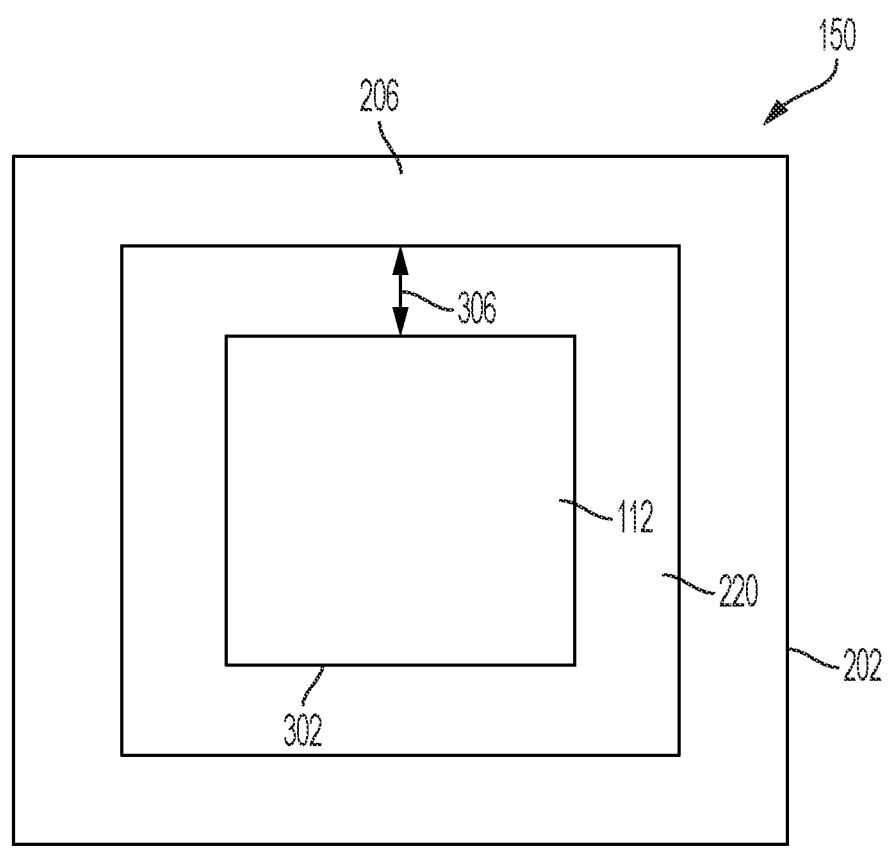
FIG. 3 depicts a schematic top view of a second interior volume of a baking chamber in accordance with at least some embodiments of the present disclosure.

FIG. 3 depicts a schematic top view of a second interior volume 206 of a baking chamber 150 in accordance with at least some embodiments of the present disclosure. In some embodiments, the substrate 112 is a photomask having a square shape. In some embodiments, the mask edge ring 220 has a central opening 302 to accommodate the substrate 112 therein. In some embodiments, the central opening 302 is a square central opening. In some embodiments, the mask edge ring 220 has a width 306 from an outer sidewall of the mask edge ring 220 to the central opening 302 of about 1.5 inches to about 3.0 inches. The mask edge ring 220 extends a baking surface of the substrates 112, advantageously promoting temperature uniformity of the substrate 112 across the substrates 112. In some embodiments, a thickness of the mask edge ring 220 is similar to a thickness of the substrate 112. In some embodiments, the mask edge ring 220 is made of a similar or same material as the substrate 112. In some embodiments, an outer diameter of the radiant heat source 208 is greater than an outer diameter of the mask edge ring 220.

Figure 4:
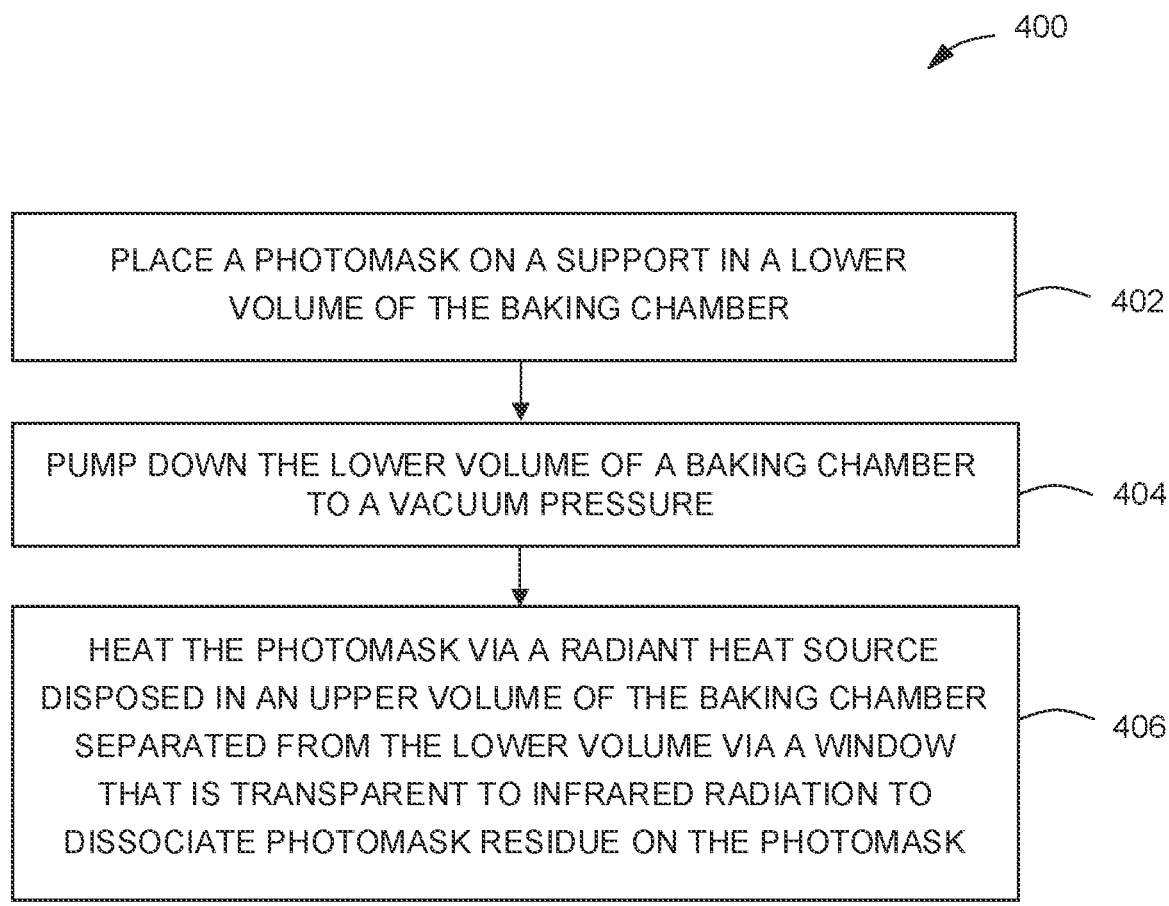
FIG. 4 depicts a flow chart of a method of baking a photomask in a baking chamber in accordance with at least some embodiments of the present disclosure.

FIG. 4 depicts a flow chart of a method 400 of baking a photomask (e.g., substrate 112) in a baking chamber (e.g., baking chamber 150) in accordance with at least some embodiments of the present disclosure. At 402, the method 400 includes placing the photomask on a support (e.g., photomask support structure 232) in a lower volume (e.g., second interior volume 206) of the baking chamber. The photomask may be placed into the baking chamber via a transfer slot (e.g., transfer slot 218). The photomask may be placed into the baking chamber manually or via a transfer robot (e.g., transfer robot 116). In some embodiments, the photomask may be first placed on one or more lift pins (e.g., lift pins 215) that are raised with respect to the support. The one or more lift pins may then be lowered to place the photomask on the support. In some embodiments, the photomask is placed within a mask edge ring (e.g., mask edge ring 220) disposed on the support.

The method 400, at 404, includes pumping down, via a vacuum pump (e.g., vacuum pump 230), the lower volume of the baking chamber to a vacuum pressure. At 406, the method 400 includes heating the photomask via a radiant heat source (e.g., radiant heat source 208) disposed in an upper volume (e.g., first interior volume 204) of the baking chamber separated from the lower volume via a window (e.g., window 210) that is transparent to infrared radiation to dissociate photomask residue on the photomask.

The upper volume may be kept at vacuum pressure or atmospheric pressure during heating. For example, the upper volume may be fluidly coupled to the vacuum pump, or a separate second vacuum pump, for pumping down the upper volume. In some embodiments, the upper volume may be coupled to a bypass valve (e.g., bypass valve 254) and a vacuum valve (e.g., vacuum valve 236) upstream of the vacuum pump, where opening the bypass valve and closing the vacuum valve maintains an atmospheric pressure in the upper volume and closing the bypass valve and opening the vacuum valve maintains a vacuum pressure in the upper volume.

The lower volume is kept at vacuum pressure, and therefore, the photomask is heated via radiant heat transfer. Pumping down the lower volume to vacuum pressure removes unwanted particles from the lower volume such as, for example, oxygen gas, water vapor, sulfur dioxide, and ammonium, which may react with the dissociated photomask residue. In some embodiments, heating the photomask comprises heating a surface of the photomask to a temperature of about 70 to about 150 degrees Celsius.

In some embodiments, a first process gas is flowed across the upper volume from a first gas inlet (e.g., first gas inlet 212) of the baking chamber to a first gas outlet (e.g., first gas outlet 214) of the baking chamber to more uniformly heat the upper volume. More uniform heating of the upper volume facilitates radiant energy entering into the lower volume through the window more uniformly and impinging upon the photomask support structure in a more uniform manner. The first process gas may consist essentially of an inert gas or air.

In some embodiments, a second process gas is flowed across the lower volume from a second gas inlet (e.g., second gas inlet 222) of the baking chamber to a second gas outlet (e.g., second gas outlet 224) of the baking chamber after heating the photomask. Flowing the second process gas in the lower volume re-pressurizes the lower volume, allowing for removal of the photomask from the lower volume. The second process gas may consist essentially of an inert gas or air.

While the foregoing is directed to embodiments of the present disclosure, other and further embodiments of the disclosure may be devised without departing from the basic scope thereof.

The invention claimed is:

1. A baking chamber for baking a photomask, comprising:
   a chamber body enclosing a first interior volume and a second interior volume, disposed beneath and fluidly independent from the first interior volume;
   a radiant heat source disposed in the first interior volume;
   a photomask support structure configured to support a photomask disposed in the second interior volume;
   a window disposed between the first interior volume the second interior volume, wherein the window is made of a material that is transparent to thermal radiation such that radiant energy from the radiant heat source can enter the second interior volume through the window and impinge upon the photomask support structure;
   a first gas inlet and a first gas outlet coupled to the first interior volume; and
   a second gas inlet and a second gas outlet coupled to the second interior volume on opposite ends thereof to facilitate flow of a process gas laterally through the second interior volume and across the photomask support structure.

2. The baking chamber of claim 1, further comprising a mask edge ring disposed on the photomask support structure and configured to surround the photomask.

3. The baking chamber of claim 2, wherein the mask edge ring has a square central opening.

4. The baking chamber of claim 1, further comprising a top reflector disposed in the first interior volume and configured to direct thermal radiation to the window.

5. The baking chamber of claim 1, wherein the radiant heat source comprises one or more infrared lamps.

6. The baking chamber of claim 1, wherein the first gas inlet and the first gas outlet are disposed on opposite sides of the chamber body and configured to flow a first process gas across the radiant heat source.

7. The baking chamber of claim 1, wherein the second gas outlet is fluidly coupled to a vacuum line.

8. The baking chamber of claim 7, wherein the first gas outlet is fluidly coupled to a first gas line, and wherein the first gas line is coupled to the vacuum line via a vacuum bypass line having a vacuum valve.

9. The baking chamber of claim 1, wherein the window is made of a material having a transmission coefficient of 0.75 or greater.

10. A baking chamber for baking a photomask, comprising:
    a chamber body enclosing a first interior volume and a second interior volume, disposed beneath and fluidly independent from the first interior volume;
    a radiant heat source comprising an infrared (IR) lamp disposed in the first interior volume;
    a photomask support structure configured to support a photomask disposed in the second interior volume;
    a window disposed between the first interior volume the second interior volume, wherein the window is made of a material that is transparent to thermal radiation such that radiant energy from the radiant heat source can enter the second interior volume through the window and impinge upon the photomask support structure;
    a first gas inlet and a first gas outlet coupled to the first interior volume; and
    a second gas inlet and a second gas outlet coupled to the second interior volume on opposite ends thereof to facilitate flow of a process gas laterally through the second interior volume and across the photomask support structure.

11. The baking chamber of claim 10, wherein the window is made of potassium bromide, zinc selenide, zinc sulfide, or potassium chloride.

12. The baking chamber of claim 10, wherein the radiant heat source is configured to heat a surface of the photomask to about 70 to about 150 degrees.

13. The baking chamber of claim 10, wherein the first gas inlet is coupled to a first gas source having an inert gas or air and the second gas inlet is coupled to a second gas source having an inert gas or air.

14. The baking chamber of claim 10, wherein the first interior volume is configured to operate at non-vacuum pressure, and the second interior volume is configured to operate at vacuum pressure.

15. The baking chamber of claim 10, further comprising a top reflector disposed in the first interior volume on a side of the radiant heat source opposite the window.

* * * * *